United States Patent [19]

Glavitsch et al.

[11] 4,063,166

[45] Dec. 13, 1977

[54] METHOD FOR LOCATING A FAULT ON A LINE NEAR TO A MEASURING LOCATION WITH THE AID OF SUBSTITUTE SIGNALS

[75] Inventors: Hans Glavitsch, Nussbaumen; Michael Vitins, Zurich, both of Switzerland

[73] Assignee: BBC Brown Boveri & Company Limited, Baden, Switzerland

[21] Appl. No.: 689,653

[22] Filed: May 24, 1976

[30] Foreign Application Priority Data

June 5, 1975 Switzerland .................... 7245/75

[51] Int. Cl.² .................................... G01R 31/08
[52] U.S. Cl. .................................... 324/52
[58] Field of Search ................ 324/51, 52; 317/36 D; 179/175.3 F

[56] References Cited

U.S. PATENT DOCUMENTS

| 3,281,673 | 10/1966 | Richardson | 324/52 |
| 3,590,368 | 6/1971 | Esclangon | 324/51 |
| 3,612,989 | 10/1971 | Souillard et al. | 324/52 |
| 3,670,240 | 6/1972 | Maranchak et al. | 324/52 |
| 3,723,864 | 3/1973 | Ricard | 324/52 |
| 3,800,215 | 3/1974 | Souillard | 324/52 |
| 3,878,460 | 4/1975 | Nimmersjo | 324/52 |
| 3,931,502 | 1/1976 | Kohlas | 324/52 X |
| 3,983,377 | 9/1976 | Vitins | 324/52 X |

*Primary Examiner*—Gerard R. Strecker
*Attorney, Agent, or Firm*—Werner W. Kleeman

[57] ABSTRACT

A method for locating a fault on a line wherein starting from a fault-free operating state of the line there is derived a substitute-measurement voltage signal which corresponds at least approximately to a frequency component of a line voltage both in magnitude and phase and is approximately independent of breakdown of the line voltage at least for a limited time interval. The substitute-measurement voltage signal is used to form at least one substitute-traveling wave signal and a substitute-evaluation signal.

4 Claims, 1 Drawing Figure

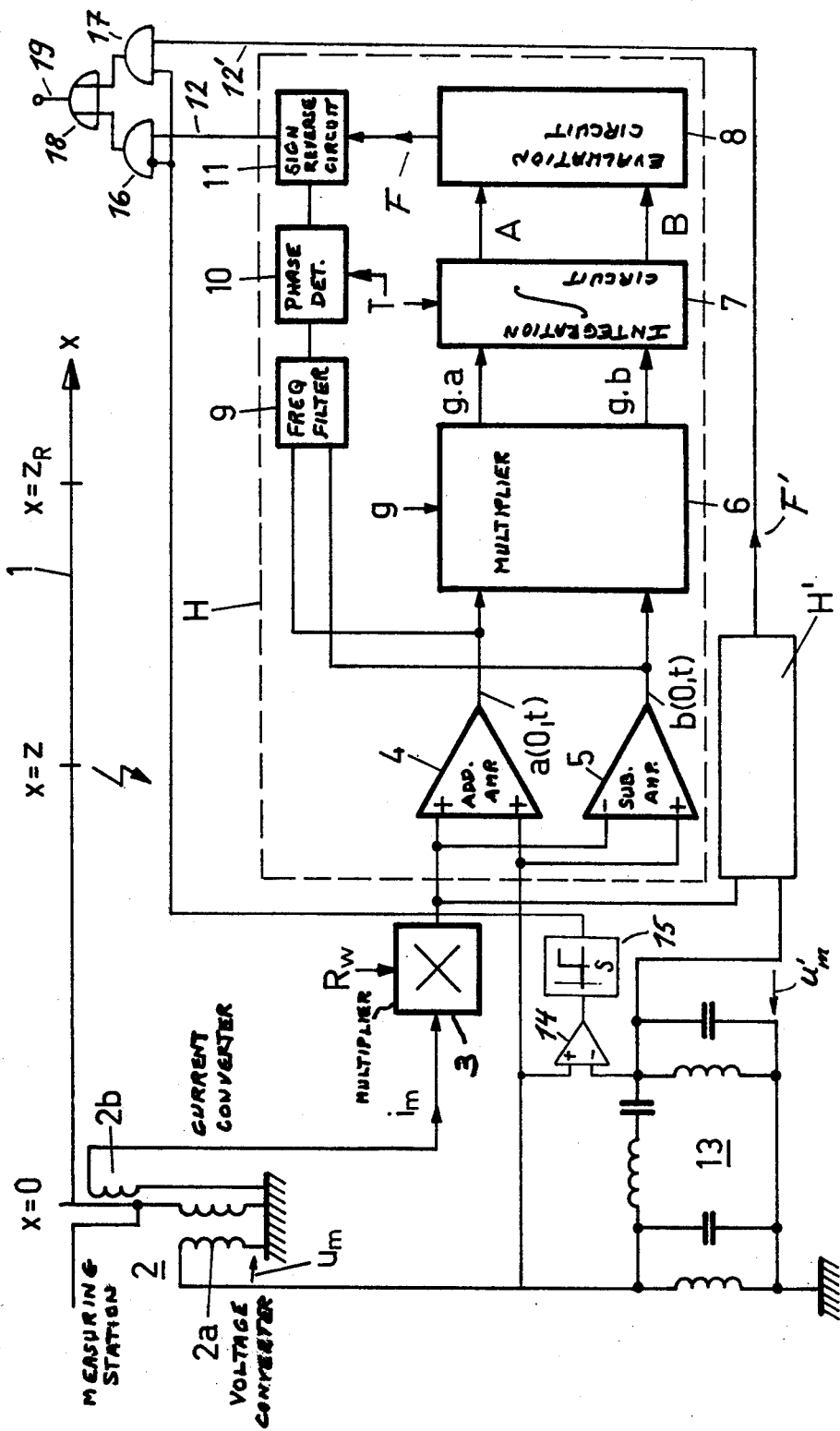

METHOD FOR LOCATING A FAULT ON A LINE NEAR TO A MEASURING LOCATION WITH THE AID OF SUBSTITUTE SIGNALS

BACKGROUND OF THE INVENTION

The present invention relates to a new and improved method for fault location on a line of the type wherein at least at a measuring location there is formed at least a measurement voltage signal derived from a line voltage and at least a measurement current signal derived from a line current, from such measurement signals there is formed at least one traveling wave signal associated with a traveling wave on the line and its variation with time at the measuring location, and there is formed an evaluation signal characterizing at least the direction of the fault location with respect to the measuring location.

The method of the present invention is an improvement upon that disclosed in the commonly assigned, copending United States application of Otto Lanz and Michael Vitins, filed Apr. 14, 1976, Ser. No. 676,983, entitled "Method And Apparatus For Locating A Fault On A Line", and the disclosure of which is incorporated herein by reference.

There are already known techniques for testing for the presence of a line fault, especially a short-circuit within a predetermined line section, which employ traveling wave signals in the sense previously discussed (U.S. Pat. No. 3,590,368). There such traveling wave signals are formed at both end stations of the line section to be monitored and by means of a special line are correlated to one another for the purpose of fault location.

Furthermore, in the previously mentioned copending application there is described a fault location method wherein at a measuring location there is formed at least one measurement voltage signal derived from a line voltage and at least one measurement current signal derived from a line current and from these measurement signals, by multiplication with different constant factors —especially multiplication of the measurement current signal with a factor corresponding to the wave or characteristic impedance of the line without changing the measurement voltage signal— as well as by summation with different signs there are formed at least two traveling wave signals of the aforementioned type which are associated with oppositely moving traveling waves on the line, and with which there can be produced an evaluation signal. Formation of the evaluation signal can be accomplished by suitably processing and linking the traveling wave signals such that the sign of the evaluation signal characterizes the direction of the fault location relative to the measuring location and the magnitude of the evaluation signal characterizes the distance of the fault location from the measuring location.

The previously discussed method and others which operate with traveling wave signals for the purpose of determining the fault direction and/or fault distance and also possibly for fault detection on lines, each have the common drawback that the line voltage at the measuring location required for formation of the traveling wave signal and the corresponding measurement voltage signal in the case of short-circuits situated close to the measuring location no longer render possible an error-free evaluation due to voltage breakdown to values close to the disturbance signal peak. Additionally, the functional dependency of the evaluation signal upon the fault location in the neighborhood of the measuring location is generally such that this signal at the measuring location continuously passes through null with change in sign. Therefore there also occurs independent of voltage breakdown, in the case of near faults, under certain circumstances, a considerable uncertainty region for the fault direction determination at the neighborhood of the measuring location.

SUMMARY OF THE INVENTION

It is a primary object of the present invention to provide a new and improved fault location method which renders possible a positive direction determination even in the case of fault locations near to the measuring location.

This objective is effectively solved according to the invention in that starting from an operating condition of the line free of faults there is derived a substitute-measurement voltage signal corresponding at least approximately to a frequency component of the line voltage both in magnitude and phase and at least approximately independent of breakdown of the line voltage at least for a limited time interval, and employing the substitute-measurement voltage signal for the formation of at least one substitute-traveling wave signal and a substitute-evaluation signal.

This solution is based upon the fact that in the line voltage there is practically always contained a frequency component, the phase position of which is only very slightly affected by the fault occurrence, especially the occurrence of a short-circuit. In the case of alternating-current lines, constituting the important field of application of the present traveling wave-fault location method, such holds true for the fundamental- or network frequency components of the line voltage which generally also dominate during the compensation process following the occurrence of the fault.

The substitute-traveling wave signals obtained in this manner are free of the uncertainty at the region of faults close to the measuring location. Further, they enable formation of evaluation signals having a jump-like course at the null crossover, and thus also avoid the uncertainty region of the direction determination which otherwise is present even with sufficient residual voltage peak, but of course however are distorted in relation to the original traveling wave signals. However, this is not disturbing for the direction determination or decision and can be generally taken into account for a distance determination relative to the measuring location by appropriately calibrating the functional dependency of the evaluation signal from the distance fault location-measuring location.

BRIEF DESCRIPTION OF THE DRAWING

The following description makes reference to the annexed drawing wherein the single FIGURE illustrates a circuit diagram of apcaratus for locating a fault and providing near or close fault compensation.

DETAILED DESCRIPTION OF THE INVENTION

Describing now the drawing, at a line 1 consisting of an above-ground conductor having the longitudinal coordinate $x$ there is provided at $x = O$ as the measuring or test location a measuring station 2 comprising a voltage converter 2a and current converter 2b, where there is formed a measurement voltage signal $u_m$ and a measurement current signal $i_m$. At $x = z$ in the neighborhood of the measuring location it is assumed that there has occurred a short-circuit which causes the line voltage at the measuring location and therefore the original measurement voltage signal to breakdown to values in the neighborhood of the disturbance signal peak.

In the exemplary embodiment there are provided two evaluation channels, namely a first channel H working with the unchanged or original measurement signals and a second channel H' working with a substitute-measurement voltage signal and corresponding substitute-traveling wave signals.

The channel H is controlled by the measuring or test station 2 directly by means of the measurement voltage signal $u_m$ and via a constant factor multiplier 3 by the product of the measurement current signal $i_m$ and a resistance or impedance factor $R_w$—for instance the wave or characteristic impedance of the line and forms therefrom in a summation or adding amplifier 4 and a subtraction amplifier 5 traveling wave signals $a(O,t)$ and $b(O,t)$ associated with two oppositely moving traveling waves on the line. These traveling wave signals characterize the temporal progression or course of such traveling waves at the measuring location $x = O$.

As has been described in detail in the previously mentioned copending application, there is formed from such traveling wave signals by multiplication with one or also a number of weighting functions $g$ in a multiplication circuit or multiplier 6 and by integration over the integration interval T in an integration circuit 7 and by linking the thus obtained time integrals A, B in an evaluation circuit 8 an evaluation signal F. The latter by means of its sign characterizes the direction of the fault location with respect to the measuring location and, if necessary, by means of its magnitude the distance of the fault location from the measuring location. In the case where there is formed only one time integral A or B for each of both oppositely moving traveling wave signals the direction determination is also dependent upon the phase position of the integration interval relative to the half cycle of the dominant fundamental oscillation —in practice thus the network frequency component— of the traveling wave signals. For the phase-dependent sign determination of the evaluation signal there is thus, for instance, provided an auxiliary branch leading from the ouput of the amplifiers 4 and 5 via a frequency filter 9 for accentuating the network frequency component and a phase detector 10 to a sign reversal circuit 11 which is activatable as a function of the phase position of the integration interval in the ascending or descending half cycle of the dominant network frequency-traveling wave signal component. This sign reversal or inverting circuit, if necessary can reverse the sign of the evaluation signal and thus render unambiguous the direction determination. As also discussed in detail in the copending application this phase detection can be replaced by a multiple integration for each propagation direction and the associated traveling wave signals respectively, in conjunction with a suitable evaluation function, for instance of the following form:

$$F = \frac{A_1 B_2 - A_2 B_1}{A_1 B_1 + A_2 B_2} \quad (1)$$

or for merely a direction determination only in the form of the numerator of this function with mutually shifted time integrals $A_1$ and $A_2$ and $B_1$ and $B_2$ respectively, for each wave propagation direction.

Moreover, by suitable weighting of the traveling wave signals with different —especially mutually time shifted—weighting functions there can be determined a random reference location $z_R$ on the line, as indicated in the drawing, and the fault direction- and fault distance determination are carried out with respect to such reference location. In particular there comes into consideration for this purpose a time displacement of the weighting functions for the oppositely moving traveling wave signals by twice the wave travel time between the measuring location and the reference location. Also by such time displacement between the oppositely moving traveling waves themselves and/or between the integration intervals there can be introduced a reference location determination.

Apart from the channel H working with the unchanged measurement signals there is provided the additional channel H' which is controlled by the same measurement current signal $i_m$ but multiplied by the factor $R_w$ i.e. the measurement current signal $R_w \cdot i_m$, and by an equivalent-measurement voltage signal $u'_m$ obtained in the oscillating circuit 13. In the embodiment under discussion this oscillation circuit 13 comprises a bandpass filter tuned to the network frequency and having a number of inductive and capacitive energy storages which after breakdown of the input side-measurement voltage signal oscillates further in a damped manner at a natural frequency corresponding to the network frequency and thus for a limited time interval —adequate for evaluation and fault location— independent of the line voltage. At the output 12' of the channel H' there thus appears a modified evaluation signal F' which is distorted relative to the evaluation signal F of the channel H, however renders possible at least one positive fault direction determination with respect to the measuring location even for local or near faults.

For producing the substitute-measurement voltage signal there can be employed apart from filter circuits having energy storages also active filters, delay lines, synchronizable oscillators and the like.

In order to be able to use for remotely located faults the evaluation signal formed from the original measurement signals and which is more advantageous in a number of respects, there is provided a comparison circuit which produces a direct or indirect validity criterion dependent upon the momentary measuring location-fault location distance for the substitute-evaluation signal F' and for the original evaluation signal F. In the exemplary embodiment the original measurement voltage signal is compared with a reference magnitude and the aforementioned criterion is derived from the decrease of the measurement voltage signal below such reference magnitude. Basically there can be used a constant reference magnitude or value, however there is here especially taken into account the fluctuations of the line voltage present during normal operation as the starting condition for the fault occurrence by using a reference magnitude which varies in the same sense as the substitute-measurement voltage signal and therefore also with the line voltage before fault occurrence. This occurs by forming the difference between the measurement voltage signal $u_m$ and the substitute-measurement voltage signal $u'_m$ in a differential amplifier 14 and by comparison of the thus obtained differential signal with a fixed boundary value $s$ in a threshold value switch 15. The latter delivers a dual or binary output signal as a function of exceeding or falling below this boundary value.

By means of the output of the threshold value switch 15 there is alternately triggered in each case one of two AND-circuits or gates 16 and 17 for the transmission of the evaluation signals F and F' respectively, via an OR-circuit or gate 18 to the terminal output 19 of the circuit. Due to the defined transition between both of the evaluation signals with their different distance-calibration curves there is obtained a closed indication region for the fault distance having two contacting sections and unambiguous transition. Moreover, in the remotely located section under the control of the channel H there can be especially carried out the mentioned reference location determination and thus there can be undertaken a subdivision of the line into random subsections, which in the near section is of lesser interest.

While there are shown and described present preferred embodiments of the invention, it is to be distinctly understood that the invention is not limited thereto, but may be otherwise variously embodied and practiced within the scope of the following claims. ACCORDINGLY,

What we claimed is:

1. A method of locating a fault on a line wherein at least at one measuring location there is formed at least one measurement voltage signal derived from a line voltage and at least one measurement current signal derived from a line current, producing from the measurement signals at least one traveling wave signal associated with the temporal progression prevailing at the measurement location of a traveling wave on the line, and forming an evaluation signal characterizing at least the direction of the location of a fault relative to the measuring location, the improvement comprising the steps of: starting from an operating condition of the line free of faults deriving a substitute-measurement voltage signal which at least approximately corresponds to a frequency component of the line voltage in magnitude and phase and is at least approximately independent of a breakdown of the line voltage for a limited time interval, and forming by means of the substitute-measurement voltage signal at least one substitute-traveling wave signal and a substitute-evaluation signal.

2. The method as defined in claim 1, including the step of using the original measurement voltage signal to form an evaluation signal and using the substitute-measurement voltage signal to form the substitute-evaluation signal, and producing a validity criterion dependent upon the momentary distance between the measuring location and the fault location for the substitute-evaluation signal and for the original evaluation signal.

3. The method as defined in claim 2, wherein the validity criterion for the substitute-evaluation signal and the original evaluation signal is formed by carrying out a comparison of a momentary magnitude of the measurement voltage signal or a magnitude derived therefrom with a reference magnitude.

4. The method as defined in claim 3, further including the step of using as the reference magnitude a magnitude which changes in the same sense as the substitute-measurement voltage signal for the comparison with the measurement voltage signal.

* * * * *